(12) United States Patent
Chou (10) Patent No.: US 9,053,968 B2
(45) Date of Patent: Jun. 9, 2015

(54) SEMICONDUCTOR PACKAGE STRUCTURE AND MANUFACTURING METHOD THEREOF

(71) Applicant: ChipMOS Technologies Inc., Hsinchu (TW)

(72) Inventor: Shih-Wen Chou, Hsinchu (TW)

(73) Assignee: ChipMOS Technologies Inc., Hsinchu (TW)

( * ) Notice: Subject to any disclaimer, the term of this patent is extended or adjusted under 35 U.S.C. 154(b) by 274 days.

(21) Appl. No.: 13/655,434

(22) Filed: Oct. 18, 2012

(65) Prior Publication Data

US 2013/0181333 A1   Jul. 18, 2013

(30) Foreign Application Priority Data

Jan. 17, 2012 (TW) .............................. 101101779 A (51) Int. Cl.
| | |
|---|---|
| *H01L 23/495* | (2006.01) |
| *H01L 25/10* | (2006.01) |
| *H01L 23/13* | (2006.01) |
| *H01L 23/31* | (2006.01) |
| *H01L 21/56* | (2006.01) |

(52) U.S. Cl.
CPC ..... *H01L 25/105* (2013.01); *H01L 2924/00014* (2013.01); *H01L 23/13* (2013.01); *H01L 23/3121* (2013.01); *H01L 21/568* (2013.01); *H01L 2224/16225* (2013.01); *H01L 2225/1088* (2013.01); *H01L 2225/1029* (2013.01)

(58) Field of Classification Search
USPC ........... 257/738, E23.031, E21.499; 438/109, 438/125, 106, 113
See application file for complete search history.

(56) References Cited

U.S. PATENT DOCUMENTS

| | | | |
|---|---|---|---|
| 5,728,599 A * | 3/1998 | Rostoker et al. | 505/330 |
| 2004/0224402 A1* | 11/2004 | Bonyhadi et al. | 435/372 |
| 2011/0215449 A1* | 9/2011 | Camacho et al. | 257/659 |

FOREIGN PATENT DOCUMENTS

| | | |
|---|---|---|
| TW | 200423362 | 11/2004 |
| TW | 200614461 | 5/2006 |
| TW | 201130176 | 9/2011 |

OTHER PUBLICATIONS

"Office Action of Taiwan Counterpart Application", issued on Oct. 20, 2014, p. 1-p. 8.

* cited by examiner

*Primary Examiner* — Matthew W Such
*Assistant Examiner* — Krista Soderholm
(74) *Attorney, Agent, or Firm* — Jianq Chyun IP Office (57) ABSTRACT

A method of manufacturing a semiconductor package structure is provided. A supporting plate and multiple padding patterns on an upper surface of the supporting plate define a containing cavity. Multiple leads electrically insulated from one another are formed on the padding patterns, extend from top surfaces of the padding patterns along side surfaces to the upper surface and are located inside the containing cavity. A chip is mounted inside the containing cavity, electrically connected to the leads. A molding compound is formed to encapsulate at least the chip, a portion of the leads and a portion of the supporting plate, fill the containing cavity and gaps among the padding patterns, and exposes a portion of the leads on the top surface. The supporting plate is removed to expose a back surface of each padding pattern, a bottom surface of the molding compound and a lower surface of each lead.

20 Claims, 8 Drawing Sheets

SEMICONDUCTOR PACKAGE STRUCTURE AND MANUFACTURING METHOD THEREOF

CROSS-REFERENCE TO RELATED APPLICATION

This application claims the priority benefit of Taiwan application Ser. No. 101101779, filed on Jan. 17, 2012. The entirety of the above-mentioned patent application is hereby incorporated by reference herein and made a part of this specification.

BACKGROUND OF THE INVENTION

1. Field of the Invention

The invention relates to a semiconductor device and a manufacturing method thereof. More specifically, the invention relates to a semiconductor package structure and a manufacturing method thereof.

2. Description of Related Art

The semiconductor package technique is categorized into various package types. The quad flat non-leaded (QFN) package belonging to the category of quad flat package and characterized in short signal transmission path and rapid signal transmission speed is suitable for high frequency (i.e., radio frequency bandwidth) chip package, and thus becomes one of the main options of low pin count package.

In a conventional method of manufacturing the quad flat non-leaded package structure, a plurality of chips are mounted on a patterned leadframe. Next, the chips are electrically connected to the leadframe via bonding wires. Thereafter, a portion of the leadframe, the bonding wires, and the chips are encapsulated by a molding compound. Finally, the aforementioned structure is singularized through punching or sawing to form a plurality of quad flat non-leaded package structures.

However, when the molding compound encapsulates the patterned leadframe, the molding compound easily overflows to a lower surface of leads because the leads of the leadframe contacts the molding compound directly and is co-planar with the molding compound, thereby affecting the electrical reliability of the leadframe. Furthermore, an extra redistribution layer (RDL) has to be created because the distance between the leads of the leadframe cannot be manufactured into a smaller distance, thus increasing the manufacturing cost.

SUMMARY OF THE INVENTION

The invention provides a semiconductor package structure and a manufacturing method thereof which effectively improves an issue of the overflow of molding compound in conventional package structures.

The invention provides a method of manufacturing a semiconductor package structure. The method includes the following. A supporting plate and a plurality of padding patterns are provided, wherein the supporting plate has an upper surface, and the padding patterns are located on the upper surface of the supporting plate. At least one containing cavity is defined by the padding patterns and the supporting plate. Each of the padding patterns has a top surface and a side surface connecting the top surface and being adjacent to the containing cavity. A plurality of leads are formed on the padding patterns. The leads extend from the top surfaces of the padding patterns along the corresponding side surfaces to the upper surface of the supporting plate and are located inside the containing cavity. The leads are electrically insulated from one another. A chip is mounted inside the containing cavity and electrically connected to the leads. A molding compound is formed to encapsulate at least the chip, a portion of the leads and a portion of the supporting plate, fill gaps among the containing cavity and the padding patterns, and expose a portion of the leads located on the top surfaces of the padding patterns. The supporting plate is removed to expose a back surface opposite to the top surface of each of the padding patterns, a bottom surface of the molding compound, and a lower surface of each of the leads.

The invention further provides a semiconductor package structure including a plurality of padding patterns, a plurality of leads, a chip, and a molding compound. Each of the padding patterns has a top surface and a back surface opposite to each other, and a side surface connecting the top surface and the back surface, wherein the side surfaces of the padding patterns are opposite to one another to define a containing cavity. The leads are disposed on the padding patterns, wherein the leads extend from the top surfaces of the padding patterns along the side surfaces to inside the containing cavity, and the leads are electrically insulated from one another. The chip is mounted inside the containing cavity and electrically connected to the leads. The molding compound encapsulates at least the chip and a portion of the leads, fills gaps among the containing cavity and the padding patterns, and exposes a portion of the leads located on the top surfaces of the padding patterns, the back surfaces of the padding patterns, and a bottom surface of each of the leads. The bottom surface of the molding compound, the lower surfaces of the leads, and the back surfaces of the padding patterns are coplanar.

Accordingly, the invention first provides the supporting plate and the plurality of padding patterns, then sequentially forms the leads extending from the top surfaces along the side surfaces of the padding patterns to the upper surface of the supporting plate, mounts the chip, forms the molding compound, and then removes the supporting plate to complete the semiconductor package structure. Hence, the molding compound is not able to overflow to the lower surfaces of the leads because the supporting plate is not yet removed when the molding compound is formed. Therefore, the manufacturing method of the semiconductor package structure of the invention effectively improves the issue of the overflow of molding compound in conventional package structures.

In order to make the aforementioned and other features and advantages of the invention more comprehensible, embodiments accompanying figures are described in detail below.

BRIEF DESCRIPTION OF THE DRAWINGS

The accompanying drawings are included to provide further understanding and are incorporated in and constitute a part of this specification. The drawings illustrate exemplary embodiments and, together with the description, serve to explain the principles of the invention.

DESCRIPTION OF EMBODIMENTS

Figure 1A:
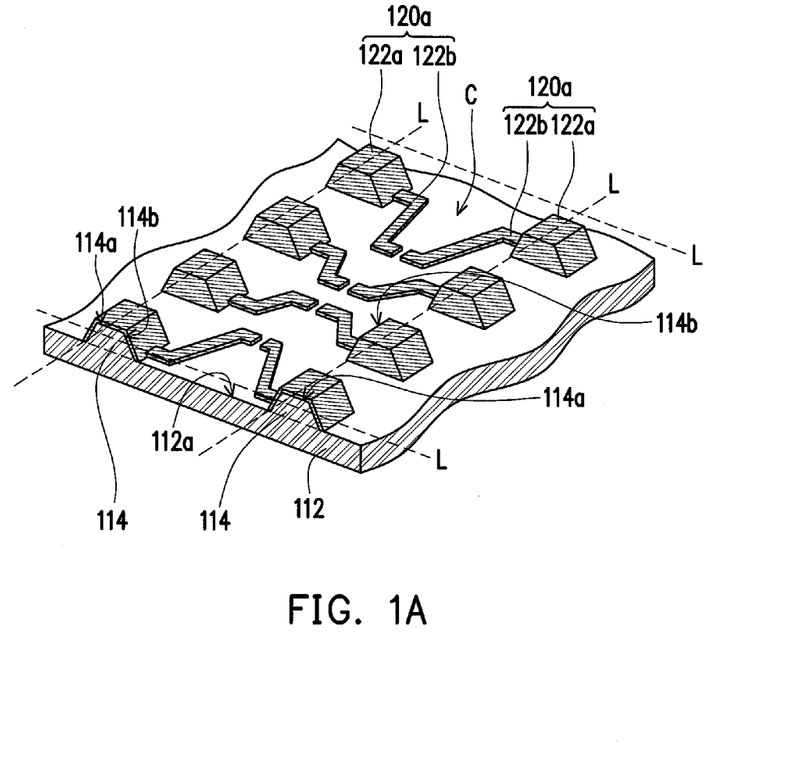
FIGS. 1A to 1F illustrate schematic views of a manufacturing method of a semiconductor package structure according to an embodiment of the invention.

FIGS. 1A to 1F illustrate schematic views of a manufacturing method of a semiconductor package structure according to an embodiment of the invention. To better facilitate the description of the invention, FIG. 1A illustrates a partial three dimension top view of a supporting plate and leads of the semiconductor package structure. FIGS. 1B-1F illustrate schematic cross-sectional views of the manufacturing method of the semiconductor package structure.

Figure 1B:
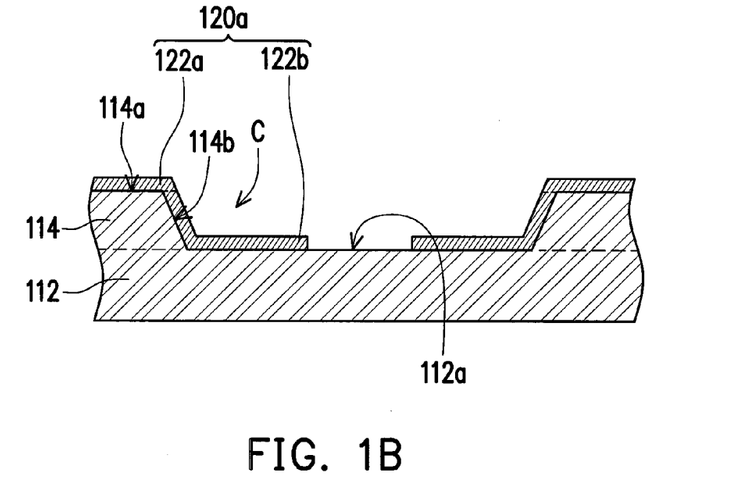

Referring to FIGS. 1A and 1B simultaneously, the manufacturing method of the semiconductor package structure in the present embodiment includes the following. First, a supporting plate 112 and a plurality of padding patterns 114 independent from one another are provided. To be more specific, the supporting plate 112 has an upper surface 112a. The padding patterns 114 are located on the upper surface 112a of the supporting plate 112 and not connected from one another, wherein the padding patterns 114 and the supporting plate 112 are formed integrally, and a material of the padding patterns 114 and the supporting plate 112 is copper, for instance. In other words, the supporting plate 112 is a supporting copper block, and the padding patterns 114 are independent padding copper blocks. In other preferred embodiments, the supporting plate 112 and the padding patterns 114 also use iron-nickel alloy. More specifically, the padding patterns 114 and the supporting plate 112 of the present embodiment form at least one containing cavity C, and each of the padding patterns 114 has a top surface 114a and a side surface 114b which connects to the top surface 114a and is adjacent to the containing cavity C.

Then, referring to FIGS. 1A and 1B simultaneously, a plurality of leads 120a are formed on the padding patterns 114; namely, on each of the padding patterns 114 is formed a lead 120a, wherein the leads 120a extend from the top surfaces 114a of the padding patterns 114 along the corresponding side surfaces 114b to the upper surface 112a of the supporting plate 112 and are located inside the containing cavity C. In the present embodiment, the leads 120a are independent from one another, and each of the leads 120a comprises an outer lead portion 122a positioned on the top surface 114a of the corresponding padding pattern 114 and an inner lead portion 122b positioned on the side surface 114b of the corresponding padding pattern 114 and the supporting plate 112. More specifically, the leads 120a of the present embodiment encapsulate the whole or a portion of the padding patterns 114, and a width of the outer lead portion 122a is equal or not equal to a width of a portion of the inner lead portion 122b on the upper surface 112a of the supporting plate 112. Herein, the width of the outer lead portion 122a is substantially greater than the width of the portion of the inner lead portion 122b on the upper surface 112a of the supporting plate 112. A method to form the leads 120a is electroplating, for instance, and a material of the leads 120a is, for instance, a conductive material such as gold or palladium.

Figure 1C:
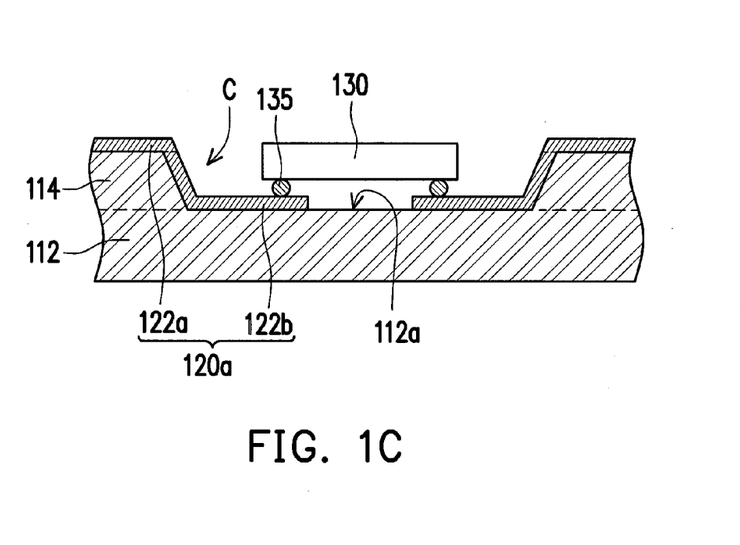

Then, referring to FIG. 1C, a chip 130 is mounted in the containing cavity C and electrically connected with the leads 120a. To be more specific, the chip 130 of the present embodiment is electrically connected with the inner lead portion 122b of the leads 120a through a plurality of conductive bumps 135.

Figure 1D:
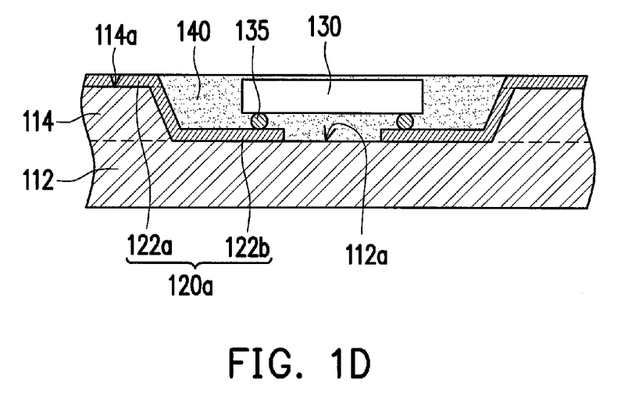

Thereafter, referring to FIG. 1D, a molding compound 140 is formed to encapsulate the chip 130, a portion of the leads 120a, and a portion of the supporting plate 112, fill gaps among the containing cavity C and the padding patterns 114 (referring to FIG. 1A), and expose a portion of the leads 120a which is on the top surface 114a of the padding patterns 114. In other words, the molding compound 140 exposes the outer lead portion 122a.

Figure 1E:
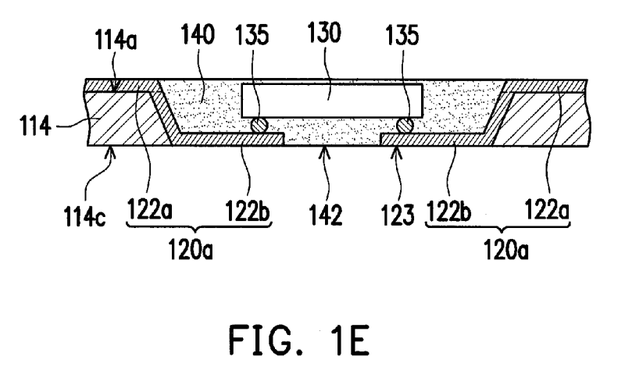

Then, referring to FIG. 1E, the supporting plate 112 is removed to expose a back surface 114c opposite to the top surface 114a of each of the padding patterns 114, a bottom surface 142 of the molding compound 140, and a lower surface 123 of each of the leads 120a. Herein, a method of removing the supporting plate 112 is etching, for instance.

Figure 1F:
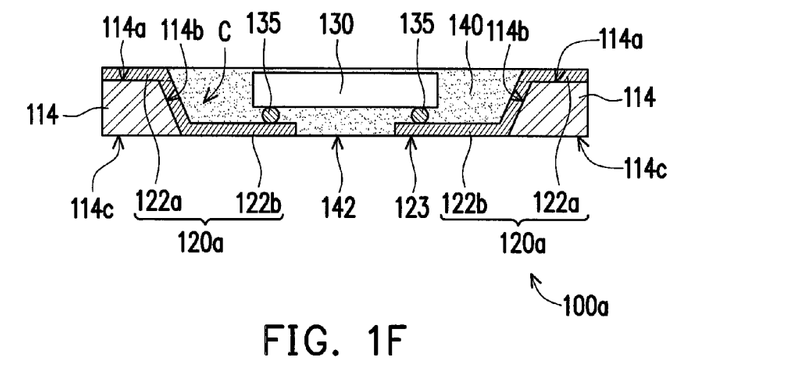

Lastly, referring to FIGS. 1A and 1F simultaneously, a dicing process is performed to dice the leads 120a and the padding patterns 114 under the leads 120a along a plurality of dicing lines L (i.e., the dotted lines in FIG. 1A) and form at least one semiconductor package structure 100a (FIG. 1F only schematically illustrates one). At this point, the manufacturing of the independent semiconductor package structure 100a is completed.

In structure, referring to FIG. 1F, the semiconductor package structure 100a of the present embodiment includes the padding patterns 114, the leads 120a, the chip 130, and the molding compound 140. The padding patterns 114 are independent from and not connected to one another; also, each of the padding patterns 114 has the top surface 114a and the back surface 114c opposite to each other, and the side surface 114b connecting the top surface 114a and the back surface 114c, wherein the side surfaces 114b of each of the padding patterns 114 are opposite to one another to define the containing cavity C. Herein, a material of the padding patterns 114 is copper or iron-nickel alloy, for instance. The leads 120a are respectively disposed on the padding patterns 114, wherein each of the leads 120a extends from the top surface 114a of the corresponding padding pattern 114 along the side surface 114b to the inside of the containing cavity C, and each of the leads 120a is electrically insulated from one another. Each of the leads 120a comprises the outer lead portion 122a positioned on the top surface 114a of the corresponding padding pattern 114, and the inner lead portion 122b positioned on the side surface 114b of the corresponding padding pattern 114 and inside the containing cavity C, wherein the width of the outer lead portion 122a is equal or not equal to the width of a portion of the inner lead portion 122b. Herein, the width of the outer lead portion 122a is substantially greater than the width of the portion of the inner lead portion 122b, and the material of the leads 120a is gold or palladium, for instance. The chip 130 is mounted inside the containing cavity C, and the chip 130 is electrically connected to the inner lead portion 122b of the lead 120a through the conductive bumps 135 disposed between the chip 130 and the inner lead portion 122b. The molding compound 140 encapsulates at least the chip 130 and a portion of the leads 120a, fills the gaps among the containing cavity C and the padding patterns 114, and exposes the outer lead portion 122a on the top surface 114a of the padding pattern 114, the back surface 114c of the padding pattern 114, and the lower surface 123 of each of the leads 120a. In particular, in the present embodiment, the bottom surface 142 of the molding compound 140 is substantially coplanar with the bottom surfaces 123 of the leads 120a and the back surfaces 114c of the padding patterns 114. Herein, the semiconductor package structure 100a is a quad flat non-leaded (QFN) package structure, for instance.

The present embodiment first provides the supporting plate 112 and the padding patterns 114, then sequentially forms the leads 120a extending from the top surfaces 114a along the side surfaces 114b of the padding patterns 114 to the upper surface 112a of the supporting plate 112, mounts the chip 130, forms the molding compound 140, and then removes the supporting plate 112 to complete the semiconductor package structure 100a. Therefore, when the molding compound 140 is formed, the molding compound 140 is not able to overflow to the lower surfaces 123 of the leads 120a because the supporting plate 112 is not yet removed. Thus, the semiconductor package structure 100a of the present embodiment effectively improves the issue of the overflow of molding compound in conventional package structures. Furthermore, since the present embodiment uses an electroplating method to form the leads 120a, compared with the conventional method which patterns (i.e., etches) a copper layer to form the leads, the manufacturing method of the leads 120a of the present embodiment satisfies the need of fine pitch.

In addition, the outer lead portion 122a and the lower surface 123 of the lead 120a which are exposed from the molding compound 140 are suitable for being electrically connected to an outside circuit (not shown), which effectively increases the range of application of the semiconductor package structure 100a. In addition, since the chip 130 of the present embodiment is mounted inside the containing cavity C and electrically connected to the inner lead portion 122b through the conductive bumps 135, a package thickness of the entire semiconductor package structure 100a is effectively decreased in order for the semiconductor package structure 100a to comply with the current demand of miniaturization.

Figure 2:
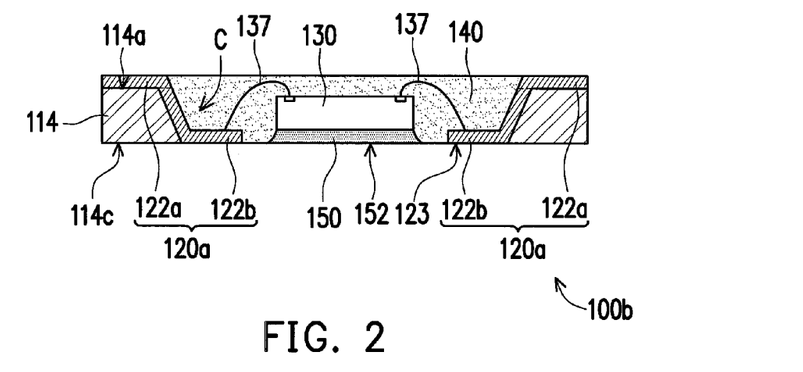
FIG. 2 is a schematic cross-sectional view of a semiconductor package structure according to an embodiment of the invention.

FIG. 2 is a schematic cross-sectional view of a semiconductor package structure according to an embodiment of the invention. The present embodiment adopts the reference numbers of components and partial content from the previous embodiment, wherein the same reference numbers are used to represent the same or similar components, and the explanation of the same technique is omitted. The omitted part of the explanation may be referred to in the previous embodiment and is hence not repeatedly described in the present embodiment. Referring to FIG. 2, the main difference between a semiconductor package structure 100b of the present embodiment and the semiconductor package structure 100a of the previous embodiment is that the semiconductor package structure 100b of the present embodiment further includes a plurality of bonding wires 137 and an adhesive layer 150. The inner lead portion 122b of the lead 120a encircles the surrounding of the chip 130, and the bonding wires 137 are disposed between the chip 130 and the inner lead portion 122b, wherein the chip 130 is electrically connected to the inner lead portion 122b through the bonding wires 137. The adhesive layer 150 is disposed under the chip 130, wherein a surface 152 of the adhesive layer 150 is substantially coplanar with the bottom surface 142 of the molding compound 140, the lower surface 123 of the lead 120a, and the back surface 114c of the padding pattern 114.

In the manufacturing process, the semiconductor package structure 100b of the present embodiment uses a similar manufacturing method as the semiconductor package structure 100a of the previous embodiment, and forms the adhesive layer 150 on the supporting plate 112 before the process of FIG. 1C, i.e. mounting the chip 130 inside the containing cavity C, wherein the adhesive layer 150 covers a portion of the upper surface 112a of the supporting plate 112. Then, when the chip 130 is mounted inside the containing cavity C, the chip 130 is fixed on the supporting plate 112 by the adhesive layer 150. Hereafter, the plurality of bonding wires 137 connected between the chip 130 and the inner lead portion 122b are formed in order for the chip 130 to electrically connect to the inner lead portion 122b through the bonding wires 137. Then, the processes of FIGS. 1D to 1E are performed sequentially, and after the supporting plate 112 is removed, the surface 152 of the adhesive layer 150 is further exposed. Lastly, the dicing process of FIG. 1F is performed, and the manufacturing of the semiconductor package structure 100b is substantially completed.

Figure 3A:
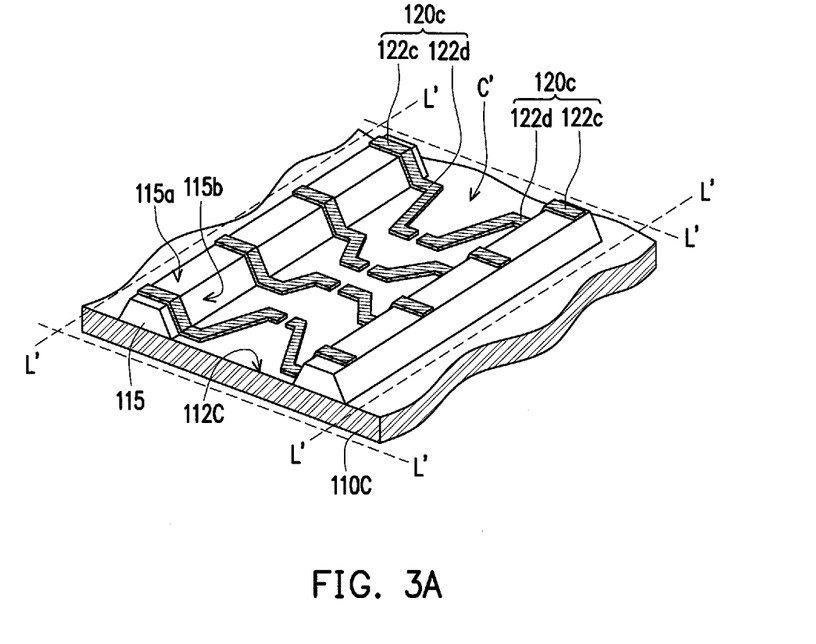
FIGS. 3A to 3F illustrate schematic views of a manufacturing method of a semiconductor package structure according to another embodiment of the invention.

FIGS. 3A to 3F illustrate schematic views of a manufacturing method of a semiconductor package structure according to another embodiment of the invention. To better facilitate the description of the invention, FIG. 3A illustrates a partial three dimension top view of a supporting plate, padding patterns, and leads of the semiconductor package structure, and FIGS. 3B to 3F illustrate schematic cross-sectional views of the manufacturing method of the semiconductor package structure.

Figure 3B:
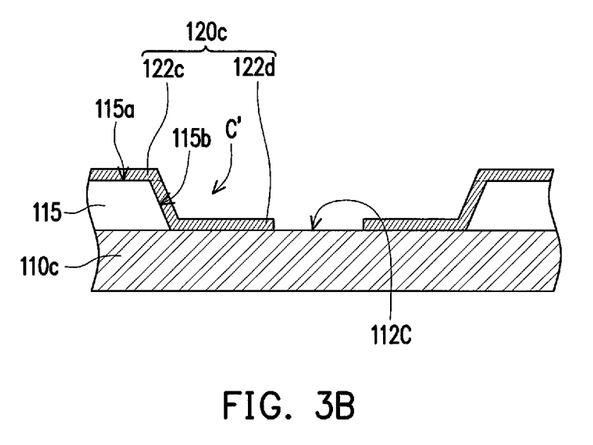

Referring to FIGS. 3A and 3B simultaneously, the manufacturing method of the semiconductor package structure in the present embodiment includes the following. First, a supporting plate 110c is provided, wherein the supporting plate 110c has an upper surface 112c, and a material of the supporting plate 110c is copper or iron-nickel alloy, for instance. Then, two padding patterns 115 are disposed on the supporting plate 110c, wherein the padding patterns 115 are opposite to each other and arranged in parallel on the upper surface 112c of the supporting plate 110c. Herein, a material of the padding patterns 115 is an epoxy resin or other appropriate insulating materials, for instance. More specifically, the supporting plate 110c and the padding patterns 115 of the present embodiment forms at least one containing cavity C', and each of the padding patterns 115 has a top surface 115a and a side surface 115b which connects the top surface 115a and is adjacent to the containing cavity C'. In addition, in the present embodiment, the padding patterns 115 are formed on the supporting plate 110c through a printing method or disposed adhesively on the supporting plate 110c thought a laminating method. The forming method of the padding patterns 115 is not limited herein.

Then, referring to FIGS. 3A and 3B, a plurality of leads 120c (FIG. 3A illustrates 4 leads 120c) are formed on each of the padding patterns 115, and the leads 120c are symmetrically arranged on the padding patterns 115, wherein the leads 120c extend from the top surface 115a of each of the padding patterns 115 along the side surface 115b to the upper surface 112c of the supporting plate 110c, and the leads 120c are located inside the containing cavity C'. In the present embodiment, the leads 120c on the same padding pattern 115 are electrically insulated from one another. Each of the leads 120c comprises an outer lead portion 122c positioned on the top surface 115a of the corresponding padding pattern 115, and an inner lead portion 122d positioned on the side surface 115b of the corresponding padding pattern 115 and the supporting plate 110c. A width of the outer lead portion 122c of the present embodiment is equal or not equal to a width of the inner lead portion 122d. Herein, the width of the outer lead portion 122c is substantially equal to the width of the inner lead portion 122d. A method of forming the leads 120c is electroplating, for instance, and a material of the leads 120c is, for instance, a conductive material such as gold or palladium.

Figure 3C:
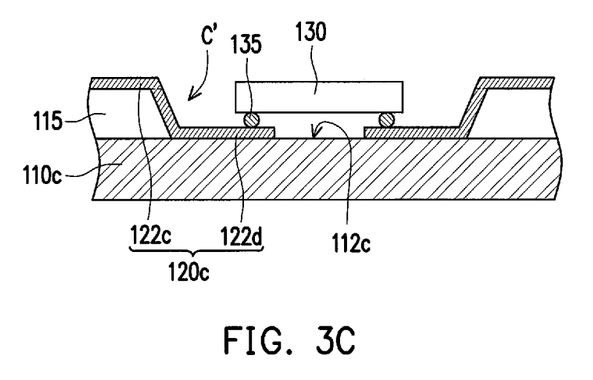

Then, referring to FIG. 3C, a chip 130 is mounted in the containing cavity C' and electrically connected with the leads 120c. To be more specific, the chip 130 in the present embodiment is electrically connected to the inner lead portion 122d of the leads 120c through a plurality of conductive bumps 135. Certainly, in other embodiments which are not illustrated in the drawings, the bonding wires 137 and the adhesive layer 150 as the above embodiments have mentioned may be used. People skilled in the art may refer to the above embodiments and select the above-mentioned components according to actual requirements in order to achieve the desired technical effect.

Figure 3D:
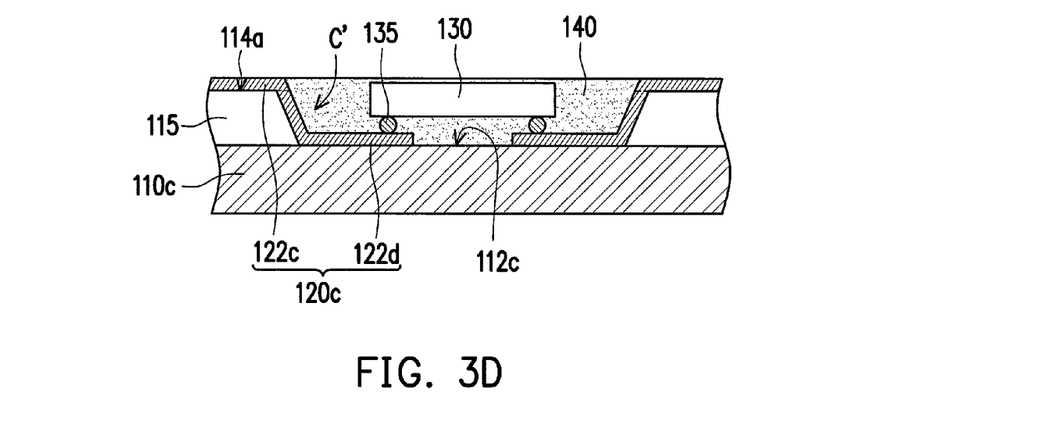

Then, referring to FIG. 3D, a molding compound 140 is formed to encapsulate the chip 130, the padding patterns 115, a portion of the leads 120c, and a portion of the supporting plate 110c, fill the containing cavity C', and expose a portion of the leads 120c located on the top surface 115a of each of the padding patterns 115. In other words, the molding compound 140 exposes the outer lead portion 122c.

Figure 3E:
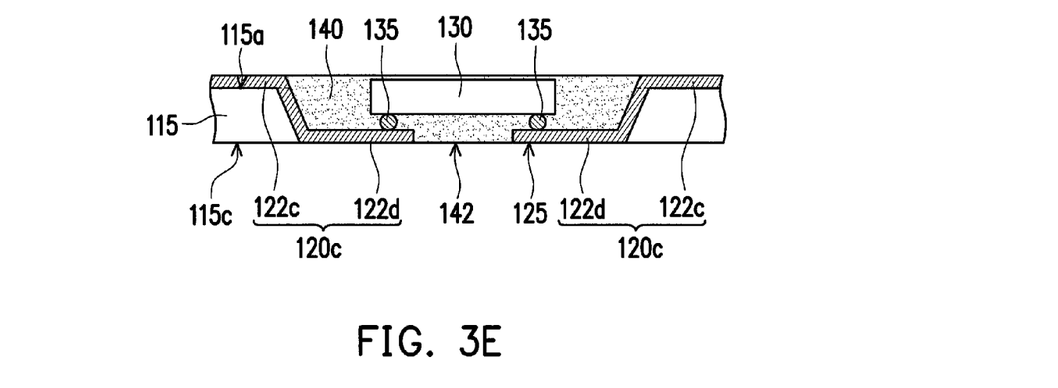

Then, referring to FIG. 3E, the supporting plate 110c is removed to expose a back surface 115c opposite to the top surface 115a of each of the padding patterns 115, a bottom surface 142 of the molding compound 140, and a lower surface 125 of each of the leads 120c. Herein, a method of removing the supporting plate 110c is etching, for instance.

Figure 3F:
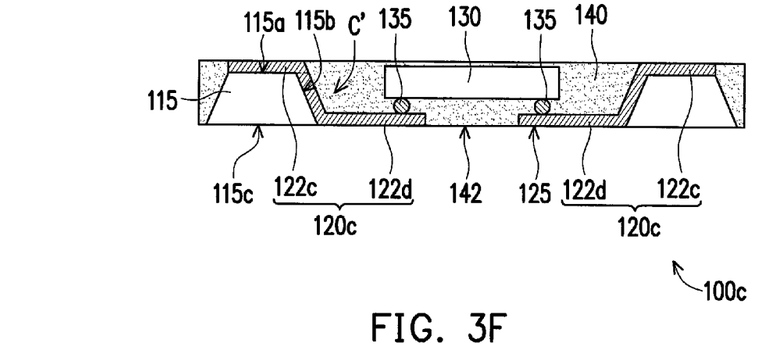

Lastly, referring to FIGS. 3A and 3F simultaneously, a dicing process is performed to dice the molding compound 140 along a plurality of dicing lines L' (i.e., the dotted lines in FIG. 3A) and form at least one semiconductor package structure 100c (FIG. 3F only schematically illustrates one). Certainly, in other embodiments which are not illustrated in the drawings, location of the dicing lines L' may be adjusted according to the requirements in order to achieve the desired technical effect; for example, the location of the dicing lines L' may be adjusted to the location of the dicing lines L in FIG. 1A. The location of the dicing lines L' is not limited herein. At this point, the manufacturing of the independent semiconductor package structure 100c is completed.

In structure, referring to FIG. 3F, the semiconductor package structure 100c of the present embodiment includes two padding patterns 115, the leads 120c, the chip 130, and the molding compound 140. The padding patterns 115 are arranged in parallel, and each of the padding patterns 115 has a top surface 115a and a back surface 115c opposite to each other, and a side surface 115c which connects the top surface 115a and the back surface 115c, wherein the side surfaces 115b of the padding patterns 115 are opposite to each other to define the containing cavity C'. Herein, a material of the padding patterns 115 is an epoxy resin or other appropriate insulating materials, for instance. The leads 120c are disposed on the padding patterns 115, and the leads 120c are arranged symmetrically on the padding patterns 115, wherein the leads 120c extend from the top surfaces 115a of the padding patterns 115 along the side surfaces 115b to the inside of the containing cavity C', and the leads 120c on the same padding pattern 115 are electrically insulated from each other. Each of the leads 120c comprises the outer lead portion 122c positioned on the top surface 115a of the corresponding padding pattern 115, and the inner lead portion 122d positioned on the side surface 115b of the corresponding padding pattern 115 and inside the containing cavity C', wherein the width of the outer lead portion 122c is equal or not equal to the width of the inner lead portion 122d. A material of the leads 120c is gold or palladium, for instance. Herein, the width of the outer lead portion 122c is substantially equal to the width of the inner lead portion 122d. The chip 130 is mounted inside the containing cavity C', and the chip 130 is electrically connected to the inner lead portion 122d through the conductive bumps 135 disposed between the chip 130 and the inner lead portion 122d. The molding compound 140 encapsulates the chip 130, a portion of the leads 120c, and a portion of the padding patterns 115, fills the containing cavity C', and exposes the outer lead portion 122c on the top surface 115a of the padding pattern 115, the back surface 115c of the padding pattern 115, and the lower surface 125 of each of the leads 120c. In particular, the bottom surface 142 of the molding compound 140 is substantially coplanar with the lower surface 125 of the leads 120c and the back surface 115c of the padding patterns 115. Herein, the semiconductor package structure 100c is a quad flat non-leaded (QFN) package structure, for instance.

The present embodiment first provides the supporting plate 110c, then sequentially disposes the padding patterns 115, forms the leads 120c extending from the top surfaces 115a of the padding patterns 115 along the side surfaces 115b of the padding patterns 115 to the upper surface 112c of the supporting plate 110c, mounts the chip 130, forms the molding compound 140, and then removes the supporting plate 110c to complete the semiconductor package structure 100c. Hence, the molding compound 140 is not able to overflow to the lower surface 125 of the leads 120c because the supporting plate 110c is not yet removed when the molding compound 140 is formed. Therefore, the manufacturing method of the semiconductor package structure 100c of the present embodiment effectively improves the issue of the overflow of molding compound in conventional package structures. Moreover, since the present embodiment uses the electroplating method to form the leads 120c, compared with the conventional method which patterns (i.e., etches) a copper layer to form the leads, the manufacturing method of the leads 120c of the present embodiment satisfies the need of fine pitch.

In addition, the outer lead portion 122c and the lower surface 125 of the leads 120c which are exposed from the molding compound 140 are electrically connected to an outside circuit (not shown), which effectively increases the range of application of the semiconductor package structure 100c. Furthermore, since the chip 130 of the present embodiment is mounted inside the containing cavity C' and electrically connected to the inner lead portion 122d through the conductive bumps 135, a package thickness of the entire semiconductor package structure 100c is effectively decreased in order for the semiconductor package structure 100c to comply with the current demands of miniaturization.

Figure 4:
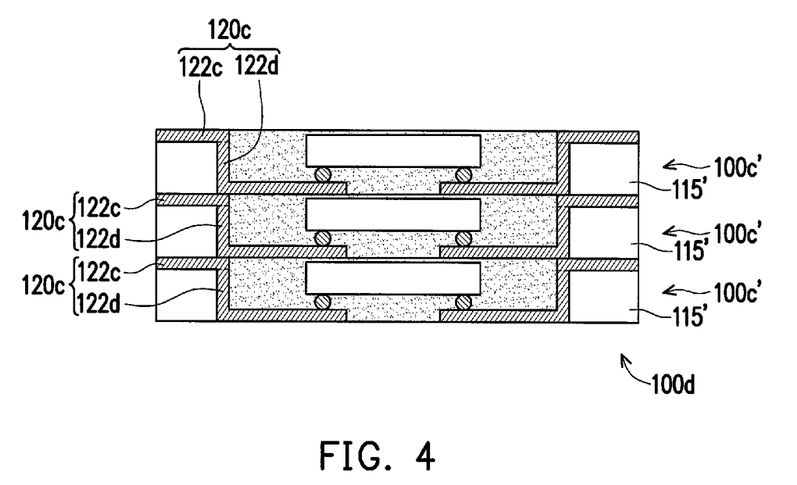
FIG. 4 is a schematic cross-sectional view of a stacked semiconductor package structure according to an embodiment of the invention.

FIG. 4 is a schematic cross-sectional view of a stacked semiconductor package structure according to an embodiment of the invention. The present embodiment adopts the reference numbers of components and partial content from the previous embodiment, wherein the same reference numbers are used to represent the same or similar components, and the explanation of the same technique is omitted. The omitted part of the explanation may be referred to in the previous embodiment and is hence not repeatedly described in the present embodiment. Referring to FIG. 4, the main difference between a semiconductor package structure 100d of the present embodiment and the semiconductor package structure 100c of the previous embodiment is that the present embodiment stacks a plurality of semiconductor package structures 100c' vertically, wherein an appearance of padding patterns 115' of the semiconductor package structures 100c' is different than an appearance of the padding patterns 115 of the semiconductor package structure 100c in the previous embodiment. The appearance of the padding patterns 115' is rectangular. The padding patterns 115' of the upper semiconductor package structure 100c' is disposed on the corresponding outer lead portion 122c of the lower semiconductor package structure 100c' in order for the vertically stacked semiconductor package structures 100c' to be electrically connected to the outer lead portion 122c of the lower leads 120c through the inner lead portion 122d of the upper leads 120c. Herein, the semiconductor package structure 100d is a stacked quad flat non-leaded package structure.

Certainly, in other embodiments which are not illustrated in the drawings, the semiconductor package structures 100a and 100b as the previous embodiments have mentioned may be used. People skilled in the art may refer to the above embodiments and select the above-mentioned components according to the actual requirements to vertically stack or vertically dislocately stack the components in order to achieve the desired technical effect.

Accordingly, the invention first provides the supporting plate and the padding patterns, then sequentially forms the leads extending from the top surfaces along the side surfaces of the padding patterns to the upper surface of the supporting plate, mounts the chip, forms the molding compound, and then removes the supporting plate to finish the semiconductor package structure. Hence, the molding compound is not able to overflow to the lower surfaces of the leads because the supporting plate is not yet removed when the molding compound is formed. Therefore, the manufacturing method of the semiconductor package structure of the invention effectively improves the issue of the overflow of molding compound in conventional package structures. Moreover, since the invention uses an electroplating method to form the leads, compared with the conventional method which patterns (etches) a copper layer to form the leads, the manufacturing method of the leads of the invention satisfies the need of fine pitch. Furthermore, the semiconductor package structure of the invention complies with current demands on miniaturization, and the range of application thereof is increased by vertical stacking.

Although the invention has been disclosed by the above embodiments, they are not intended to limit the invention. It will be apparent to one of ordinary skill in the art that modifications and variations to the invention may be made without departing from the spirit and scope of the invention. Accordingly, the scope of the invention falls in the appended claims.

What is claimed is:

1. A method of manufacturing a semiconductor package structure, comprising:
   providing a supporting plate and a plurality of padding patterns, wherein the supporting plate has an upper surface, the padding patterns are on the upper surface of the supporting plate, the padding patterns and the supporting plate form at least one containing cavity, and each of the padding patterns has a top surface and a side surface connecting the top surface and being adjacent to the containing cavity;
   forming a plurality of leads on the padding patterns, wherein the leads extend from the top surfaces of the padding patterns along the corresponding side surfaces to the upper surface of the supporting plate and are located inside the containing cavity, and the leads are electrically insulated from one another, and each of the leads comprises an outer lead portion positioned on the top surface of the corresponding padding pattern, and an inner lead portion positioned inside the containing cavity;
   mounting a chip inside the containing cavity, the chip being electrically connected to the leads;
   forming a molding compound to encapsulate at least the chip, a portion of the leads and a portion of the supporting plate, fill gaps among the containing cavity and the padding patterns, and expose a portion of the leads located on the top surfaces of the padding patterns; and
   removing the supporting plate to expose a back surface opposite to the top surface of each of the padding patterns, a bottom surface of the molding compound, and a lower surface of each of the leads.

2. The method of manufacturing the semiconductor package structure as claimed in claim 1, wherein the padding patterns and the supporting plate are formed integrally, and a material of the padding patterns and a material of the supporting plate comprise copper or iron-nickel alloy.

3. The method of manufacturing the semiconductor package structure as claimed in claim 2, wherein the leads are disposed on the padding patterns respectively, and the padding patterns are not connected to one another.

4. The method of manufacturing the semiconductor package structure as claimed in claim 2, wherein the inner lead portion is positioned on the side surface of the corresponding padding pattern and on the supporting plate.

5. The method of manufacturing the semiconductor package structure as claimed in claim 1, wherein a material of the supporting plate comprises copper or iron-nickel alloy, and a material of the padding patterns comprises an epoxy resin.

6. The method of manufacturing the semiconductor package structure as claimed in claim 5, wherein the number of the padding patterns is two, the padding patterns are opposite to each other and arranged in parallel on the upper surface of the supporting plate, the leads are symmetrically arranged on the padding patterns, and the molding compound encapsulates the chip, a portion of the padding patterns, a portion of the leads, and a portion of the supporting plate.

7. The method of manufacturing the semiconductor package structure as claimed in claim 6, wherein the inner lead portion is positioned on the side surface of the corresponding padding pattern and on the supporting plate.

8. The method of manufacturing the semiconductor package structure as claimed in claim 1, wherein the chip is electrically connected to the leads through a plurality of conductive bumps.

9. The method of manufacturing the semiconductor package structure as claimed in claim 1, wherein the chip is electrically connected to the leads through a plurality of bonding wires.

10. The method of manufacturing the semiconductor package structure as claimed in claim 9, further comprising:
   forming an adhesive layer on the supporting plate before mounting the chip into the containing cavity, wherein the adhesive layer covers a portion of the upper surface of the supporting plate;
   fixing the chip on the supporting plate through the adhesive layer when mounting the chip to the containing cavity; and
   exposing a surface of the adhesive layer after removing the supporting plate.

11. The method of manufacturing the semiconductor package structure as claimed in claim 1, further comprising:
   performing a dicing process to form at least one semiconductor package structure after removing the supporting plate.

12. A semiconductor package structure, comprising:
   a plurality of padding patterns having a top surface and a back surface opposite to each other and a side surface connecting the top surface and the back surface, wherein the side surfaces of the padding patterns are opposite to one another to define a containing cavity;
   a plurality of leads disposed on the padding patterns, wherein the leads extend from the top surfaces of the padding patterns along the side surfaces to the inside of the containing cavity, and the leads are electrically insulated from one another, each of the leads comprises an outer lead portion positioned on the top surface of the corresponding padding pattern, and an inner lead portion positioned inside the containing cavity;
   a chip mounted inside the containing cavity and electrically connected to the leads; and a molding compound encapsulating at least the chip and a portion of the leads, filling gaps among the containing cavity and the padding patterns, and exposing a portion of the leads located on the top surfaces of the padding patterns, the back surfaces of the padding patterns, and a lower surface of each of the leads, wherein a bottom surface of the molding compound, the lower surfaces of the leads, and the back surfaces of the padding patterns are coplanar.

13. The semiconductor package structure as claimed in claim 12, wherein a material of the padding patterns comprises copper or iron-nickel alloy.

14. The semiconductor package structure as claimed in claim 13, wherein the padding patterns are not connected to one another, and the leads are disposed on the padding patterns respectively.

15. The semiconductor package structure as claimed in claim 12, wherein a material of the padding patterns comprises an epoxy resin.

16. The semiconductor package structure as claimed in claim 15, wherein the number of the padding patterns is two, the padding patterns are arranged in parallel, the leads are symmetrically arranged on the padding patterns, and the molding compound encapsulates the chip, a portion of the leads, and a portion of the padding patterns.

17. The semiconductor package structure as claimed in claim 12, further comprising a plurality of conductive bumps disposed between the chip and the leads, wherein the chip is electrically connected to the leads through the conductive bumps.

18. The semiconductor package structure as claimed in claim 12, further comprising a plurality of bonding wires disposed between the chip and the leads, wherein the chip is electrically connected to the leads through the bonding wires.

19. The semiconductor package structure as claimed in claim 18, further comprising an adhesive layer disposed under the chip, wherein a surface of the adhesive layer is coplanar with the bottom surface of the molding compound, the lower surfaces of the leads, and the back surfaces of the padding patterns.

20. The semiconductor package structure as claimed in claim 12, wherein a material of the leads comprises gold or palladium.

* * * * *